United States Patent
Sharma et al.

(10) Patent No.: US 7,527,983 B2
(45) Date of Patent: May 5, 2009

(54) FERROMAGNETIC MATERIAL

(75) Inventors: Parmanand Sharma, Dehli (IN); Kudumboor Venkat Rao, Stockholm (SE); Börje Johansson, Uppsala (SE); Rajeev Ahuja, Uppsala (SE)

(73) Assignee: Spintronix AB, Stockholm (SE)

( * ) Notice: Subject to any disclaimer, the term of this patent is extended or adjusted under 35 U.S.C. 154(b) by 378 days.

(21) Appl. No.: 10/544,655

(22) PCT Filed: Feb. 6, 2004

(86) PCT No.: PCT/SE2004/000150

§ 371 (c)(1), (2), (4) Date: Feb. 21, 2006

(87) PCT Pub. No.: WO2004/069767

PCT Pub. Date: Aug. 19, 2004

(65) Prior Publication Data
US 2006/0148105 A1 Jul. 6, 2006

(30) Foreign Application Priority Data
Feb. 6, 2003 (SE) .................................. 0300352

(51) Int. Cl.
*H01L 21/00* (2006.01)
(52) U.S. Cl. .................. 438/3; 257/421; 117/84
(58) Field of Classification Search .............. 438/3; 257/421; 117/84
See application file for complete search history.

(56) References Cited

U.S. PATENT DOCUMENTS

| 6,995,961 | B2 * | 2/2006 | Hasegawa et al. ...... 360/324.12 |
| 7,022,182 | B1 * | 4/2006 | Yoshida et al. ................ 117/84 |
| 7,115,213 | B2 * | 10/2006 | Yoshida et al. ......... 252/62.51 R |
| 2003/0184925 | A1 * | 10/2003 | Hasegawa et al. ...... 360/324.12 |
| 2004/0112278 | A1 * | 6/2004 | Yoshida et al. ................ 117/30 |
| 2005/0095445 | A1 * | 5/2005 | Yoshida et al. .............. 428/570 |
| 2006/0114606 | A1 * | 6/2006 | Ide ............................. 360/125 |
| 2006/0148105 | A1 * | 7/2006 | Sharma et al. ................. 438/3 |

(Continued)

FOREIGN PATENT DOCUMENTS

EP 1 219 731 A1 7/2002

(Continued)

OTHER PUBLICATIONS

Katsuyasu, Kawano, et al.; "Electron Spin Resonance Study of Laser-Annealed (Zn,Mn)O Ceramics", Appl. Phys. Lett., Apr. 22, 1991, pp. 1742-1744, American Institute of Physics, 1991.

(Continued)

*Primary Examiner*—Laura M Menz
(74) *Attorney, Agent, or Firm*—Buchanan Ingersoll & Rooney PC

(57) ABSTRACT

A method is provided for producing a doped dilute ferromagnetic semiconductor material, by doping Zinc Oxide in bulk form with manganese to a maximum level of 5 atomic percent concentration. The material is preferably sintered at a maximum temperature of 650° C. The result of this process is a semiconductor material comprising Mn-doped ZnO with a Mn concentration not exceeding 5 atomic percent, wherein the Mn-doped ZnO is ferromagnetic within at least a part of the temperature range from about 218 Kelvin to about 425 Kelvin.

20 Claims, 4 Drawing Sheets

U.S. PATENT DOCUMENTS

2007/0190367 A1* 8/2007 Rao et al. .............. 428/842.3
2008/0087972 A1* 4/2008 Rao et al. .............. 257/421

FOREIGN PATENT DOCUMENTS

WO    WO 2004069767 A1 *  8/2004

OTHER PUBLICATIONS

Ohno, H.; "Making Nonmagnetic Semiconductors Ferromagnetic"; Science; Aug. 14, 2998; pp. 951-955.

Dietl, T., et al.; "Zener Model Description of Ferromagnetism in Zinc-Blende Magnetic Semiconductors"; Science; Feb. 11, 2000; vol. 287; pp. 1019-1022.

Matsumoto, Yuji, et al.; "Room-Temperature Ferromagnetism in Transparent Transition Metal-Doped Titanium Dioxide"; Science; Feb. 2, 2001; pp. 854-856; vol. 291.

Nado K., et al.; "Magneto-Optical Properties of ZnO-Based Diluted Magnetic Semiconductors"; Journal of Applied Physics; Jun. 1, 2001; pp. 7284-7286; vol. 89, No. 11.

Takamura, K., et al.; "Magnetic Properties of (Al,Ga,Mn)As"; Applied Physics Letters; Sep. 30, 2002; pp. 2590-2592; vol. 81, No. 14.

Chambers, Scott A.; "A Potential Role in Spintronics"; Materials Today; Apr. 2002; pp. 34-39; Elsevier Science Ltd.

Ohno, Hideo, et al.; "Semiconductor Spin Electronics"; JSAP International; Jan. 2002; pp. 4-13; No. 5.

Ueda, Kenji, et al., "Magnetic and Electric Properties of Transition-Metal-Doped ZnO Films"; Applied Physics Letters; Aug. 13, 2001; pp. 988-990; vol. 79, No. 7; American Institute of Physics.

Thaler, G.T., et al.; "Magnetic Properties of $n$-GaMnN Thin Films"; Applied Physics Letters; May 27, 2002; pp. 3964-3966; vol. 80, No. 21; American Institute of Physics.

Stampe, P.A., et al.; "Investigation of the Cobalt Distribution in $TiO_2$: Co Thin Films"; Journal of Applied Physics; Dec. 15, 2002; pp. 7114-7121; vol. 92, No. 12; American Institute of Physics.

Kim, Jae Hyun, et al.; "Magnetic Properties of Epitaxially Grown Semiconducting $Zn_{1-x}Co_xO$ Thin Films by Pulsed Laser Deposition"; Journal of Applied Physics; Nov. 15, 2002; pp. 6066-6071; vol. 92, No. 10; American Institute of Physics.

Fukumura, T., et al.; "An Oxide-Diluted Magnetic Semiconductor: Mn-Doped ZnO"; Applied Physics Letters; Nov. 22, 1999; pp. 3366-3368; vol. 75, No. 21; American Institute of Physics.

Fukumura, T., et al.; "Magnetic Properties of Mn-Doped ZnO"; Applied Physics Letters; Feb. 12, 2001; pp. 958-960; vol. 78, No. 7; American Institute of Physics.

Jung, S.W., et al.; "Ferromagnetic Properties of $Zn_{1-x}Mn_xO$ Epitaxial Thin Films"; Applied Physics Letters; Jun. 17, 2002; pp. 4561-4563; vol. 80, No. 24; American Institute of Physics.

Tiwari, A., et al.; "Structural, Optical and Magnetic Properties of Diluted Magnetic Semiconducting Zn1-xMnxO Films"; Solid State Communications; 2002; pp. 371-374; Pergamon.

Pearton, S.J., et al.; "Wide Band Gap Ferromagnetic Semiconductors and Oxides"; Journal of Applied Physics; Jan. 1, 2003; pp. 1-13, vol. 93, No. 1.

* cited by examiner

FERROMAGNETIC MATERIAL

FIELD OF INVENTION

The present invention relates to materials used for electronic components which use ferromagnetism in its function.

BACKGROUND

Components based on materials with ferromagnetic properties are devised to affect or rectify the spin orientation of bosons and fermions, e.g. electrons. The search for materials with ferromagnetism above room temperatures in dilute magnetic semiconductors has been a quest in recent years, especially to develop a potentially rich new class of future devices which exploit the electron spin state i.e. spintronics. The types of components for these devices include magnetic memories, e.g. hard discs, semiconductor magnetic memories, e.g. MRAM, spin valve transistors, spin light emitting diodes, non-volatile memory, logic devices, quantum computers, optical isolators, sensors, ultra-fast optical switches etc. Dilute magnetic semiconductors can also be used in electronic-, and magnetic-based products.

DESCRIPTION OF RELATED ART

Electronic component technologies are increasingly interested in using ferromagnetic materials for new component designs and functions. Traditional ferromagnetic materials are e.g. iron, nickel, cobalt and their alloys. Novel scientific activities and new suggestions for implementing them, are frequently being reported in technical and scientific journals. Some examples of materials expectations with basic component designs can be found in recent review articles in Physics World, (April 1999) and IEEE Spectrum, (December 2001). All these documentations describe the problem and needs in designing ferromagnetic materials that can operate at the industrial, automotive and military temperature range, normally −55° C. to 125° C. Other pieces of prior art within this technical field are listed in a list of references below.

Most of the materials of interest known today require cryogenic temperatures. However Klaus H. Ploog described in Physical Review Letters, July 2001, the use of a film of iron grown on Gallium Arsenide (GaAs) to polarize the spin of electrons injected into semiconducting GaAs. This experiment was carried out at room temperature.

Spintronic devices such as spin valve transistors, spin light emitting diodes, non-volatile memory, logic devices, optical isolators and ultra-fast optical switches are some of the areas of high interest for introducing the ferromagnetic properties at room temperature in a semiconductor described in the two documents of reference 6 and 7.

In recent years there have been intense search for materials exhibiting ferromagnetic ordering in doped dilute magnetic semiconductors (DMS), described in the five documents of reference 1-5, focusing on possible spin transport properties which has many potentially interesting device applications. Among the materials reported so far, Mn-doped GaAs has been found to be ferromagnetic with the highest reported Curie temperature, Tc~110 K, see reference 1. Following this, Dietl et al. predicted on a theoretical basis that ZnO and GaN would exhibit ferromagnetism above room temperature on doping with Mn, see reference 2. This prediction initiated intensive experimental work on a variety of doped dilute magnetic semiconductors. Recently, Tc above room temperature has been reported in Co-doped $TiO_2$, ZnO, and GaN respectively, see references 3,8,9. However, in the $Ti_{1-x}Co_xO$ sample inhomogeneous clustering of Co was found, see reference 10. Kim et al, see reference 11, showed that while homogeneous films of $Zn_{1-x}Co_xO$ exhibited a spin-glass behaviour, room temperature ferromagnetism was found in inhomogeneous films attributing the observation to the presence of Co clusters.

REFERENCES

1. Ohno, H. Making Nonmagnetic semiconductors ferromagnetic. Science 281, 951-956 (1998); see also a recent review: S. J. Pearton et al JAP 93, 1 (2003).
2. Dietl, T. et al. Zener model description of ferromagnetism in zinc-blende magnetic semiconductors. Science 287, 1019-1022 (2000)
3. Matsumoto, Y. et al. Room-temperature ferromagnetism in transparent transition metal-doped titanium dioxide. Science 291, 854-856 (2001)
4. Ando, K. et al. Magneto-optical properties of ZnO-based dilute magnetic semiconductors. J. Appl. Phys. 89(11), 7284-7286 (2001)
5. Takamura, K. et al. Magnetic properties of (Al,Ga,Mn)As. Appl. Phys. Letts 81(14), 2590-2592 (2002)
6. Chambers, S. A. A potential role in spintronics. Materials Today, 34-39 (April 2002)
7. Ohno, H. Matsukura, F. & Ohno, Y. Semiconductor spin electronics. JSAP international 5, 4-13 (2002)
8. Ueda, K. Tabata, H. & Kawai, T. Magnetic and electric properties of transition-metal-doped ZnO films. Appl. Phys. Letts 79(7), 988-990 (2001)
9. Thaler, G. T. et al. Magnetic properties of n-GaMN thin films. Appl. Phys. Letts. 80(21), 3964-3966 (2002)
10. Stampe, P. A. et al. Investigation of the cobalt distribution in TiO2:Co thin films. J. Appl. Phys. 92(12), 7114-7121 (2002)
11. Kim, J. H. et al. Magnetic properties of epitaxially grown semiconducting Zn1-xCoxO thin film by pulsed laser deposition. J. Appl. Phys. 92(10), 6066-6071 (2002)
12. Fukumura, T. et al. An oxide-diluted magnetic semiconductor: Mn-doped ZnO. Appl. Phys. Letts. 75(21), 3366-3368 (1999)
13. Fukumura, T. et al. Magnetic properties of Mn doped ZnO. Appl. Phys. Letts. 78(7), 958-960 (2001)
14. Jung, S. W. et al. Ferromagnetic properties of Zn1-xMnxO epitaxial thin films. Appl. Phys. Letts. 80(24), 4561-4563(2002)
15. Tiwari, A. et al. Structural, optical and magnetic properties of diluted magnetic semiconducting Zn1-xMnxO films. Solid State Commun. 121, 371-374 (2002)

SUMMARY OF INVENTION

Accordingly, there are still advances to be made within the field of ferromagnetic materials. It is therefore a general object of the present invention to provide a material with ferromagnetic properties, and means for producing such a material, which overcomes certain disadvantages related to the prior art. In particular, it is clear that for many device applications homogeneous material films are needed, and an aspect of the general object is therefore to provide means for producing such homogeneous material films.

The present invention is based on the concept to create ferromagnetism into doped dilute magnetic semiconductors by doping Zinc Oxide (ZnO) with Manganese (Mn). Tailoring of ferromagnetism above room temperature in bulk Mn (<4 atomic %) doped ZnO has been achieved. In this state Mn is found to carry a moment 0.16 $\mu_B$. Ferromagnetic Resonance (FMR) data on these samples have confirmed the surprising results of the existence of ferromagnetic order at temperatures even as high as 425 K. In the paramagnetic state the Paramagnetic Resonance data show that Mn is in the 2+ state ($Mn^{2+}$) with a g value 2.0029. Ab initio calculations confirm the above findings. On sintering the bulk at temperatures above 700° C., the ferromagnetism around room temperatures is completely suppressed giving rise to the often reported pronounced 'ferromagnetic-like'ordered state below 40 K. The material also shows room temperature ferromagnetic ordering in 2-3 µm thick transparent films deposited on fused quartz substrates at temperatures below 600° C. by Pulsed Laser deposition using the same bulk materials as targets. The ferromagnetic dilute Mn doped ZnO can also be obtained as transparent nanoparticles.

The demonstrated new capability renders possible the realization of complex elements for spintronic devices and other components. Manganese doped Zinc oxide, with ferromagnetic properties in the specified temperature range can also be manufactured with a sputtering system where either two metallic (Zinc and Manganese) targets are used simultaneously or one sintered ZnO:Mn ceramic target.

The present invention is defined by the appended claims.

BRIEF DESCRIPTION OF DRAWINGS

Preferred embodiments of the present invention will be described below with reference to the accompanying drawings, on which.

DETAILED DESCRIPTION OF PREFERRED EMBODIMENTS

Figure 1:
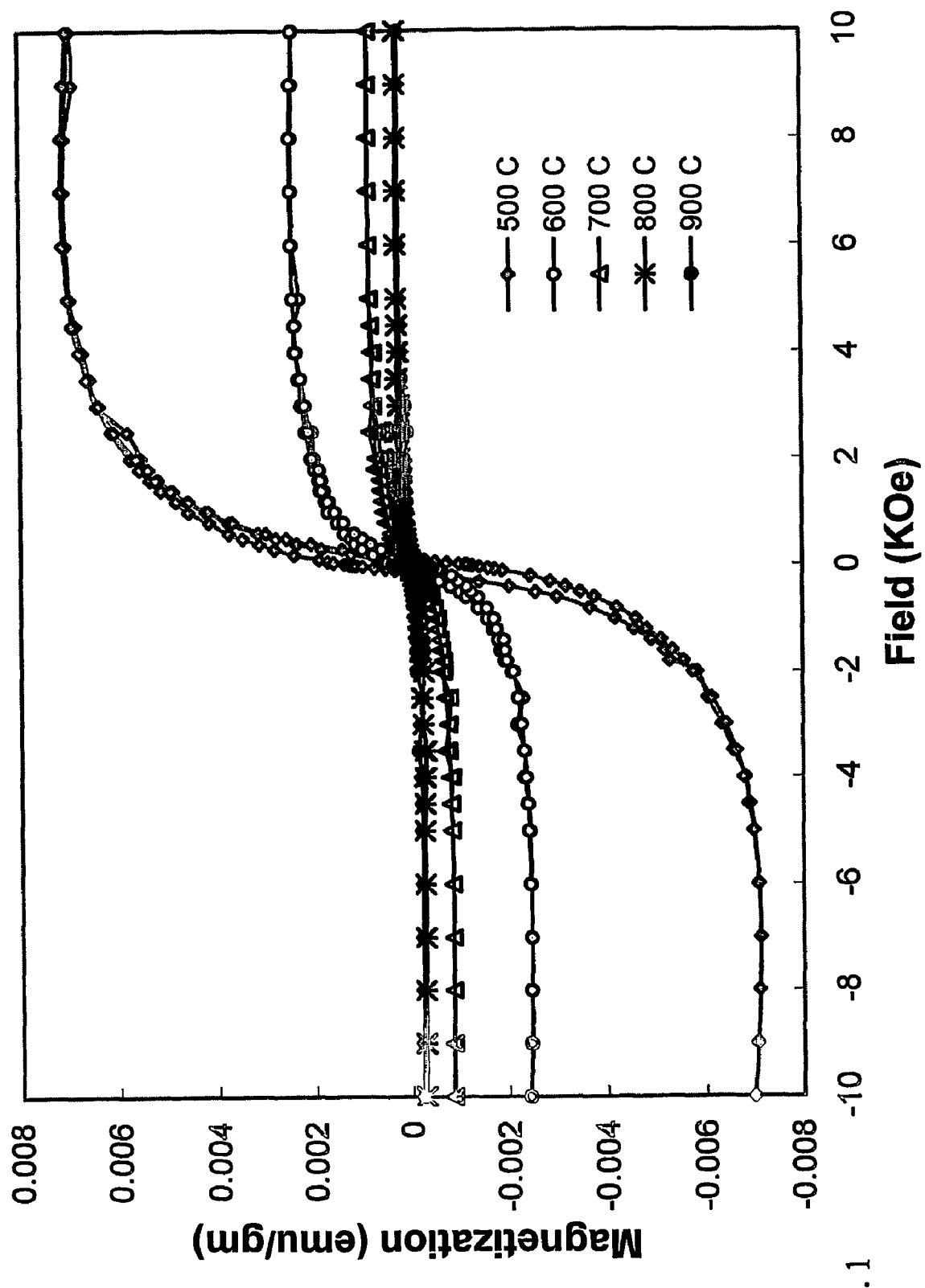
FIG. 1 shows a room temperature hysteresis loops showing ferromagnetic ordering in nominal 2% Mn doped ZnO pellets sintered at various temperatures according to an embodiment of the invention.
Figure 2:
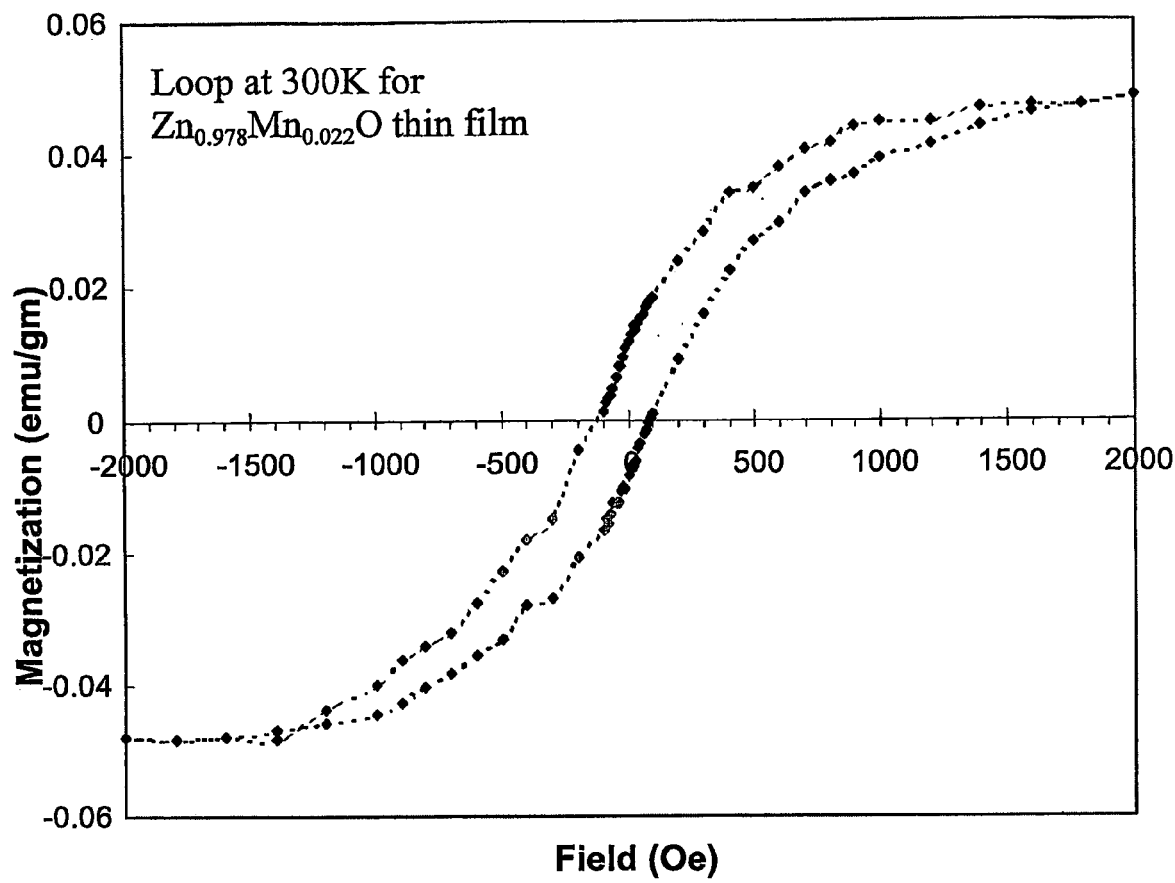
FIG. 2 show a M(H) hysteretic loop data at 300 K for $Zn0.978Mn0.0220$ PLD deposited thin film on fused quartz, after subtracting the diamagnetic contribution (shown as an insert) arising from the fused quartz substrate in the 'as obtained' data from SQUID measurements.
Figure 2:
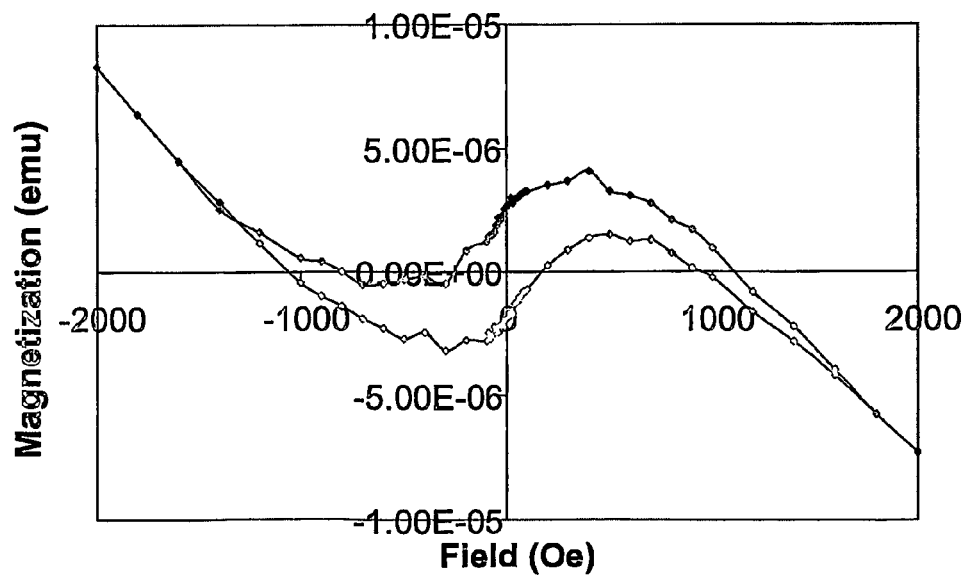
Figure 3:
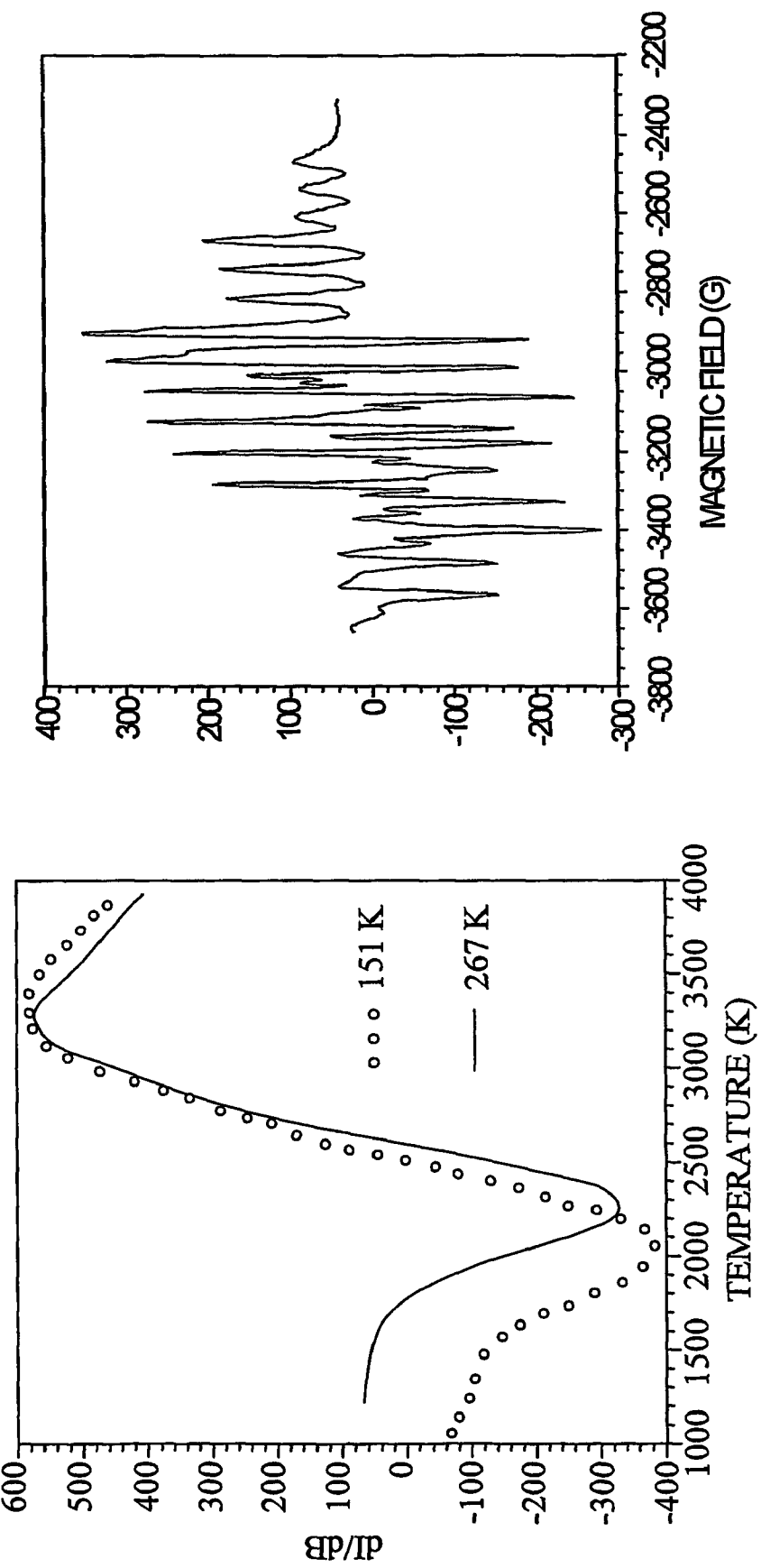
FIG. 3 shows a) the Ferromagnetic resonance spectra for nominal 2 at % Mn doped ZnO pellet sintered at 500° C., and (b) the paramagnetic resonance spectra for the same sample sintered at 900° C.
Figure 4:
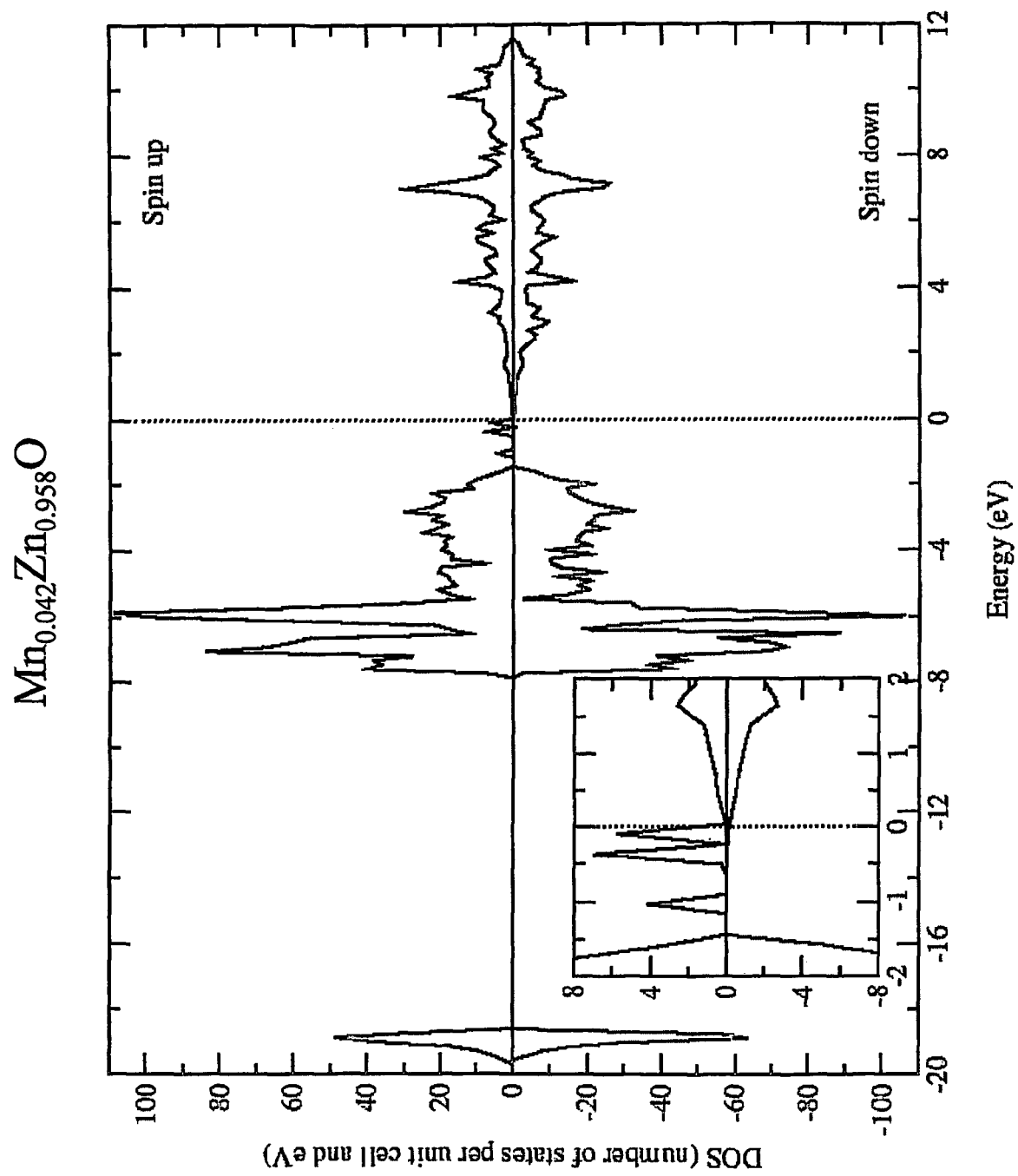
FIG. 4 shows the calculated density of states (DOS) for $Zn0.958Mn0.0420$, Fermi level is set at zero, where inset shows the DOS near to the Fermi level, and the states just below the Fermi level arising from the Mn 3d states. Below to Mn-3d states, the states between 4 to 6 eV are from 0-2p states and states between 6 to 8 eV are arising from Zn-3d states.

The present invention is based on the concept to create ferromagnetism in doped dilute magnetic semiconductors by doping Zinc Oxide (ZnO) with Manganese (Mn) in bulk or film materials. Our experiments shows successful tailoring of ferromagnetism above room temperature in bulk Mn doped ZnO. The Mn doping level should then be less than 4-5 at % (atomic percent) for bulk materials. Theoretically we find that the upper limit for ferromagnetism is about 5 at % Mn. Experimentally we have found that due to materials problems, above 4 at % n there is a clear tendency for the Mn atoms to form clusters which are then antiferromagnetic and that suppresses the ferromagnetic order. SEM observations show, on samples above 2 at %, local clustering and the samples becomes inhomogeneous, which affects the material so that the around room temperatures ferromagnetic effect disappears at 4-5 at %. In ZnO, the thermal solubility of 3d-transition metals such as Mn is larger than 10 mol % and the electron 'effective mass' is as large as ~0.3 $m_e$, where $m_e$ is free electron mass, see reference 12. Therefore the amount of injected spins and carriers in the film can be large, thus making Mn doped ZnO ideal for the fabrication of spintronic devices. Moreover ZnO is a well-known piezoelectric and electro-optic material, and therefore incorporation of magnetic property in ZnO can lead to variety of new multifunctional phenomena.

Theoretical predictions claim that only p-type Mn doped ZnO will be ferromagnetic above room temperature. However, our experiments show that n-type ZnO can also be ferromagnetic above room temperature, but the ferromagnetism tends to decrease as the n-type carrier in the material increases. In the room temperature ferromagnetic state of our samples Mn is found to carry a moment 0.16 µB. Ferromagnetic Resonance (FMR) data confirm the existence of ferromagnetic order at temperatures as high as 425 K in both pellets and thin films. In the paramagnetic state the EPR spectra show that Mn is in the $2^+$ state ($Mn2^+$). Furthermore, ferromagnetism above room temperature is also observed in the calcined (below 500° C.) powder. Our ab initio calculations confirm the above findings. If sintering of the Mn doped ZnO material is carried out at higher temperatures the doped material shows an additional large paramagnetic contribution at room temperatures and the ferromagnetic component becomes negligible. On sintering the bulk at temperatures above 700° C., ferromagnetism around room temperatures is completely suppressed giving rise to the often reported pronounced 'ferromagnetic-like' ordered state below 40 K. Experiments with sintering temperatures of 700° C., 800° C. and 900° C. have confirmed this fact.

Room temperature ferromagnetic ordering has also been obtained in 2-3 µm thick films deposited on fused quartz substrates at temperatures below 600° C., by Pulsed Laser deposition using the same bulk materials as targets. The doping concentration in these film materials should be less than 3-4 at % in order to obtain controlled homogeneity. Experiments have shown that samples below 2 at % can be tailored to be homogeneous in composition with slight variations but containing no clusters. In laser ablation the substrate temperature effects the Mn concentration in the film. Films deposited at higher temperatures are found to have a high concentration of Mn in comparison to films deposited at low temperatures. This means that the temperature could be used to control the Mn concentration.

The precursor ZnO and $MnO_2$ powders (purity 99.99%) used in the present study to make Mn doped ZnO were characterized initially for their magnetic properties using quantum design, MPMS2-SQUID magnetometer. SQUID measurements showed diamagnetic behavior for the ZnO powder, while $MnO_2$ was found to be anti-ferromagnetic below 100 K as expected. Appropriate amounts of ZnO and MnO2 powders were mixed, calcined at 400° C. for 8 hours, and sintered in air at different temperatures ranging from 500 to 900° C. for 12 hours to obtain $Zn_{1-x}Mn_xO$ (nominal x=0.01, 0.02, and 0.1 at % respectively) ceramic pellets.

The effect of sintering temperature on the magnetic properties of nominal 2% Mn doped ZnO has been specifically studied, and ferromagnetic ordering above room temperature (Tc>420 K) has been found. The room temperature ferromagnetic phase as a function of sintering temperatures, as indicated by M(H) measurements, are shown in FIG. 1. Elemental mapping for the pellet sintered at 500° C. showed a uniform distribution of Mn in the sample. However local Mn concentration was found to be much lower (~0.3 at %) than the nominal composition. Taking this fact into consideration, we evaluate the saturation magnetization of the ferromagnetic phase and determine the moment per Mn atom to be 0.16 µB. Sometimes on sintering the pellets in the temperature range 600° C.-700° C. in addition to the ferromagnetic component we observe a linear paramagnetic contribution in the magnetic hysteretic loops at high fields. However, sintering the pellets above 700° C. completely suppresses ferromagnetism around room temperature. The doped dilute semiconductor can also be processed, by particle size selection, into transparent and ferromagnetic nanoparticles.

Manganese doped Zincoxide can be manufactured with a sputtering system where either two metallic (Zinc and Manganese) targets are used simultaneously or one sintered ZnO:Mn ceramic target as described previously. When using two metallic targets the sputtering energy on the Zn and Manganese targets are adjusted in such a way that the resulting Manganese content is in the 1-5% range. An exact recipe has to be adjusted to the sputtering equipment that is used and depends on energy, geometry and gases. This technique is, however, well known to the skilled person. The substrate temperature on the deposition substrate is in the same range as when using laser deposition.

X-ray Diffraction as well as SEM high resolution elemental mapping analyses on both the bulk as well as thin film Mn doped ZnO materials obtained by us are found to be homogeneous with no sign of cluster formation or distribution in them.

Incidentally, in both the bulk and the transparent films we obtained their ferromagnetic resonance spectra which provide convincing evidence for the existence of ferromagnetism. The demonstrated new capability renders possible the realization of complex elements for spintronic devices. These type of films materials are transparent and could be used for magneto-optical components. ZnO has a large electromechanical coupling coefficient and is therefore also good for piezoelectric applications and combinations for optical, magneto and mechanical sensor or component solutions.

Total energy calculations were performed using the projector augmented-wave (PAW) method as invoked by the VASP program package based on the generalized-gradient approximation (GGA). The parameterization for the exchange and correlation potential proposed by Perdew et al was employed. In the present calculations we made use of PAW potentials which valence states 3p, 3d and 4s for Mn, 3d and 4s for Zn and 2s and 2p for O. The periodic supercell approach is employed and the energy cutoff was 600 eV. The optimization of the geometry has been done (ionic coordinates and c/a ratio), using the Hellmann-Feynman forces on the atoms and stresses on the supercell for each volume. For sampling the irreducible wedge of the Brillouin zone we used k-point grids of 4×4×2 for the geometry optimization and 8×8×4 for the final calculation at the equilibrium volume.

Various embodiments of the present invention, both regarding the inventive material as such and means for producing it in various forms, have been discussed above. However, these should merely be regarded as examples and not as limitations. The scope of the invention is defined by the appended claims.

The invention claimed is:

1. A method for producing a ferromagnetic semiconductor material comprising Mn doped ZnO comprising the following steps:
   mixing appropriate amounts of ZnO and MnO$_2$ powders forming a mixture in powder form, and,
   sintering said mixture at a maximum temperature of about 700° C., whereby Mn doped ZnO having a Mn concentration below 5 atomic % and which is ferromagnetic at least at one temperature in the range in temperature from 218 Kelvin to 425 Kelvin is obtained.

2. A method for producing a ferromagnetic semiconductor material comprising Mn doped ZnO comprising the following steps:
   providing a bulk material of Mn doped ZnO, and
   creating a thin film on said bulk material by means of Pulsed Laser deposition at a maximum temperature of 600° C. using said bulk material as target, whereby a thin film of Mn doped ZnO having a Mn concentration below 4 atomic % and which is ferromagnetic at least at one temperature in the range in temperature from 218 Kelvin to 425 Kelvin is obtained on said bulk material.

3. A method for producing a ferromagnetic semiconductor material comprising Mn doped ZnO comprising the following steps:
   producing said material by sputtering to a deposition substrate, simultaneously using two metallic targets of Zinc and Manganese, respectively;
   controlling the temperature on the deposition substrate to a maximum of 650° C.; and
   adjusting a sputtering energy on the Zinc and Manganese targets such that a resulting Manganese content in the 1-5 atomic % range is achieved, whereby Mn doped ZnO having a Mn concentration below 5 atomic % and which is ferromagnetic at least at one temperature in the range in temperature from 218 Kelvin to 425 Kelvin is obtained.

4. A method for producing a ferromagnetic semiconductor material comprising Mn doped ZnO comprising the steps of:
   producing said material by sputtering to a deposition substrate, using a sintered ZnO:Mn ceramic target;
   controlling the temperature on the deposition substrate to a maximum of 650° C.; and
   adjusting a sputtering energy on the target such that a resulting Manganese content in the 1-5 atomic % range is achieved, whereby Mn doped ZnO having a Mn concentration below 5 atomic % and which is ferromagnetic at least at one temperature in the range in temperature from 218 Kelvin to 425. Kelvin is obtained.

5. The method as recited in claim 1 further comprising the step of: subjecting said mixture to a calcining process, before the step of sintering the mixture.

6. The method as recited in claim 5, wherein said calcining process is carried out at a temperature below 500° C.

7. The method as recited in claim 1, further comprising the step of:
   processing, by means of particle size selection, said Mn doped ZnO having a Mn concentration below 5 atomic % arid which is ferromagnetic at least at one temperature in the range in temperature from 218 Kelvin to 425 Kelvin to form transparent and ferromagnetic nanoparticles.

8. A ferromagnetic semiconductor material comprising Mn-doped ZnO wherein said Mn-doped ZnO has a Mn concentration not exceeding 5 atomic %, and is ferromagnetic within at least a part of the temperature range from about 218 Kelvin to about 425 Kelvin.

9. The material as recited in claim 8, which is transparent.

10. The material as recited in claim 8 which is piezoelectric

11. A semiconductor material comprising Mn-doped ZnO obtainable by the method according to claim 1 whereby said material comprises Mn-doped ZnO which has a Mn concentration not exceeding 5 atomic %, and which is ferromagnetic within at least a part of the temperature range from about 218 Kelvin to about 425 Kelvin.

12. A substrate having at least one thin layer deposited on at least one part of its surface, wherein said layer comprises a material according to claim 8.

13. A component to be used for electronic applications, wherein said component comprises a material according to claim 8.

14. A component to be used for spintronic applications, wherein said component comprises a material according to claim 8.

15. A. component to be used for optical applications, wherein said component comprises a material according to claim 8.

16. The method as recited in claim 2, further comprising the step of:
processing, by means of particle size selection, said Mn doped ZnO having a Mn concentration below 5 atomic % arid which is ferromagnetic at least at one temperature in the range in temperature from 218 Kelvin to 425 Kelvin to form transparent and ferromagnetic nanoparticles.

17. The material as recited in claim 9 which is piezoelectric

18. A substrate having at least one thin layer deposited on at least one part of its surface, wherein said layer comprises a material according to claim 9.

19. A component to be used for electronic applications, wherein said component comprises a material according to claim 9

20. A component to be used for spintronic applications, wherein said component comprises a material according to claim 9.

* * * * *